United States Patent [19]

Kouno et al.

[11] Patent Number: 5,345,237
[45] Date of Patent: Sep. 6, 1994

[54] DIFFERENTIAL AMPLIFIER AND TWO-STEP PARALLEL A/D CONVERTER

[75] Inventors: Hiroyuki Kouno; Takahiro Miki; Toshio Kumamoto, all of Itami, Japan

[73] Assignee: Mitsubishi Denki Kabushiki Kaisha, Tokyo, Japan

[21] Appl. No.: 77,932

[22] Filed: Jun. 18, 1993

[30] Foreign Application Priority Data

Jul. 1, 1992 [JP] Japan .................. 4-174282

[51] Int. Cl.⁵ .................. H03M 1/14; H03M 1/34; H03M 1/36; H03F 3/45
[52] U.S. Cl. .................. 341/156; 330/252; 341/159; 341/158
[58] Field of Search ............... 341/156, 155, 158, 159; 330/252

[56] References Cited

U.S. PATENT DOCUMENTS

| | | | |
|---|---|---|---|
| 4,890,067 | 12/1989 | Lamb | 330/252 |
| 4,928,073 | 5/1990 | Arai et al. | 330/252 |
| 5,138,318 | 8/1992 | Matsuzawa | 341/156 |

OTHER PUBLICATIONS

IEEE Journal of Solid–State Circuits, vol. 24, No. 1, Feb. 1, 1989, pp. 13–20, Shimizu, et al., "A 10-bit 20-MHz Two-Step Parallel A/D Converter with Internal S/H".

"Transistor Gijutsu", Dec. 1990, p. 512, FIG. 2(a).

Primary Examiner—Sharon D. Logan
Attorney, Agent, or Firm—Oblon, Spivak, McClelland, Maier & Neustadt

[57] ABSTRACT

The present invention is directed to improvement of a differential amplifier an its peripheral components employed in an A/D converter to enhance an accuracy of the A/D converter. The differential amplifier has an amplifying element comprised of a pair of differential transistors Q1 and Q2, emitter resistances 2a and 2b, and collector resistances 2c and 2d. The differential amplifier has transistors Q3 and Q4 constituting an emitter follower for applying an output amplified in the differential amplifying element to the outside. The differential amplifier includes transistors Q5 and Q6 having their respective base electrodes connected to input terminals 4a and 4b and serially connected to the transistors Q3 and Q4, and resistances 2e and 2f interposed between emitter electrodes of the transistors Q5 and Q6 so as to relieve any influence of variations in base-emitter voltages of the transistors Q3 and Q4. Effectively an output from the emitter follower can be improved and a gain of the differential amplifier and linearity can be also improved.

12 Claims, 9 Drawing Sheets

DIFFERENTIAL AMPLIFIER AND TWO-STEP PARALLEL A/D CONVERTER

BACKGROUND OF THE INVENTION

1. Field of the Invention

The present invention relates to a two-step parallel A/D converter converting an analog signal to a digital signal, and more particularly, it relates to a technology directed to enhance an accuracy of an A/D converter and improvement of a differential amplifier utilized therefore.

2. Description of the Prior Art

Figure 5:
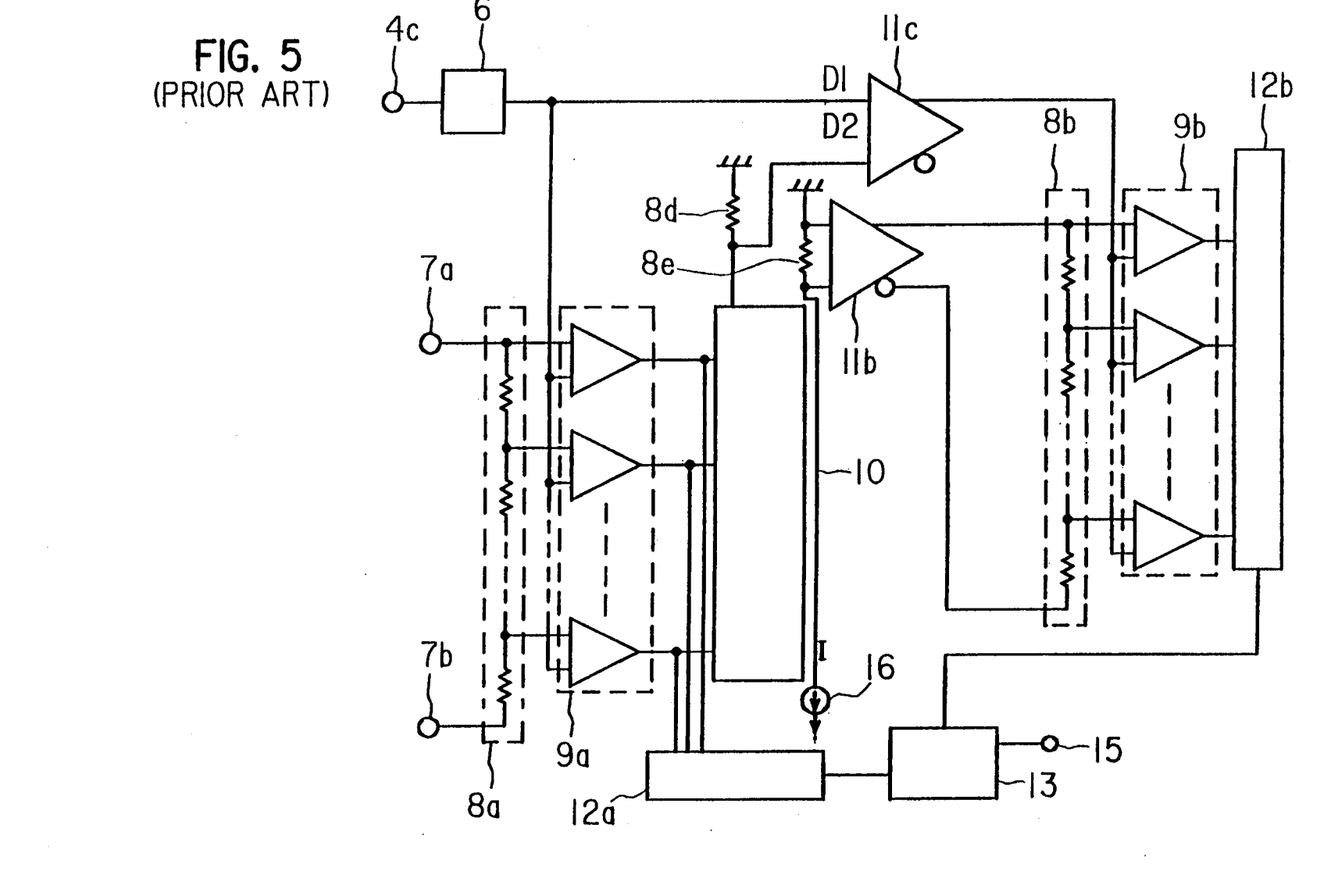
FIG. 5 is a block diagram showing an architecture of a prior art two-step parallel A/D converter.

FIG. 5 is a block diagram showing an exemplary two-step parallel A/D converter in the prior art as described in IEEE Journal of Solid-State Circuits, vol.24, No.1, Feb. 1989, pp. 13–20. Referring to FIG. 5, the A/D converter includes an input terminal 4c for receiving an analog signal, a sample-and-hold circuit 6 (referred to as "S/H circuit" hereinafter) for sampling an instantaneous value of a sequentially varying analog signal and holding it for a specified period of time, a positive reference voltage terminal 7a and a negative reference voltage terminal 7b, a group 8a of resistances connected in series between the reference voltage terminals 7a and 7b for dividing coarse A/D conversion reference voltage to perform A/D conversion of high-order digits (i.e., upper bits), a group 9a of comparators which have their respective first input terminals receiving an input signal from the input terminal 4c and second input terminals connected to the resistance group 8a respectively, for comparing respectively the divided coarse A/D conversion reference voltage with voltage of the input signal to perform A/D conversion of the high-order digits, a D/A converter 10 receiving an output from each comparator of the comparator group 9a for converting a digital signal of the high-order digits (i.e., a coarse digital signal) into an analog signal, and a resistance 8d connected to the D/A converter 10 for outputting the analog signal corresponding to the coarse digital signal.

The prior art two-step parallel A/D converter further includes a resistance 8e connected to the D/A converter 10 for converting constant current produced by the D/A converter 10 into voltage, a first differential amplifier 11c having its first input terminal connected to one of terminals of the resistance 8d and its second input terminal connected to an output terminal of the S/H circuit 6 for amplifying difference voltage obtained by subtracting voltage of an analog signal D2 corresponding to the coarse digital signal from voltage of an input signal D1 to output the resultant voltage from its first output terminal, a second differential amplifier 11b having its first and second input terminals connected to opposite first and second terminals of the resistance 8e for outputting reference voltage from its first and second output terminals, a group 8b of resistances connected in series between the first and second output terminals of the second differential amplifier 11b for dividing fine A/D conversion reference voltage, a group 9b of comparators which have their respective first input terminals receiving an output from the first differential amplifier 11c and second input terminals connected to the resistances of group 8b respectively for comparing respectively the divided fine A/D conversion reference voltage with the output from the first differential amplifier 11b or the amplified difference voltage obtained by subtracting the voltage of the analog signal D2 from the voltage of the input signal D1 to perform A/D conversion of low-order digits (i.e., lower bits), an encode circuit 12a receiving an output from each comparator of the comparator group 9a to encode the output digital signal of high-order digits, an encode circuit 12b for receiving an output from each comparator of the comparator group 9a to encode the output digital signal of low-order digits, an adder 13 for receiving output signals from the encode circuits 12a and 12b to add them, an output terminal 15 connected to an output terminal of the adder 13 for outputting a coded digital signal, and a constant current source 16 for supplying constant current to the resistance 8e. The resistance group 8a and the comparator group 9a constitute a coarse A/D converting unit for obtaining high-order digits of digital signals, and the resistance group 8b and the comparator group 9b constitute a fine A/D converting unit for obtaining low-order digits of digital signals (i.e., fine digital signals).

An operation of the A/D converter shown in FIG. 5 will now be described. This converter is a two-step parallel A/D converter which includes a coarse A/D converting unit for performing A/D conversion of high-order digits and a fine A/D converting unit for performing A/D conversion of low-order digits to perform A/D conversion of an analog input signal input thereto twice to convert it into a digital signal.

An analog signal received from the input terminal 4c is sampled and held by the S/H circuit 6. The analog signal D1 held by the S/H circuit 6 is transmitted to each comparator of the comparator group 9a. Coarse A/D conversion reference voltage applied to the reference voltage terminals 7a and 7b is divided by the resistance group 8a and each of them transferred to each comparator of the comparator group 9a respectively. Then, in each comparator of the comparator group 9a, the first comparison of the divided coarse A/D conversion reference voltage with the analog signal D1 is performed, and a result of the comparison is transmitted to the encode circuit 12a and the D/A converter 10. In the encode circuit 12a, the digital signal of the high-order digits is coded and then output to the adder 13. The D/A converter 10 converts the coarse digital signal input thereto into the analog signal D2 and then transmit it to the first differential amplifier 11e serving as a subtracter.

The first differential amplifier 11c subtracts the analog signal D2 output from the D/A converter 10 from the analog signal D1 output by the S/H circuit 6. Voltage of the difference obtained by subtraction of the analog signal D2 from the analog signal D1 is transmitted to the fine A/D converting unit, and the second comparison is performed. The difference voltage output from the first output terminal of the first differential amplifier 11c is transmitted to the comparator group 9b and applied to the first input terminal of each comparator. The fine A/D conversion reference voltage output by the second differential amplifier 11b is divided by the resistance group 8b and then input to the second input terminal of each comparator of the comparator group 9b, respectively. Then, each comparator of the comparator group 9a compares the divided fine A/D conversion reference voltage with the difference voltage and transmits a result of comparison to the encode circuit 12b. The encode circuit 12b converts the result of the comparison in the comparator group 9b into digital data to output it to the adder 13. The adder 13 adds output data from the coarse and fine A/D converting units, corrects a result, and produce a desired digital output.

Figure 4:
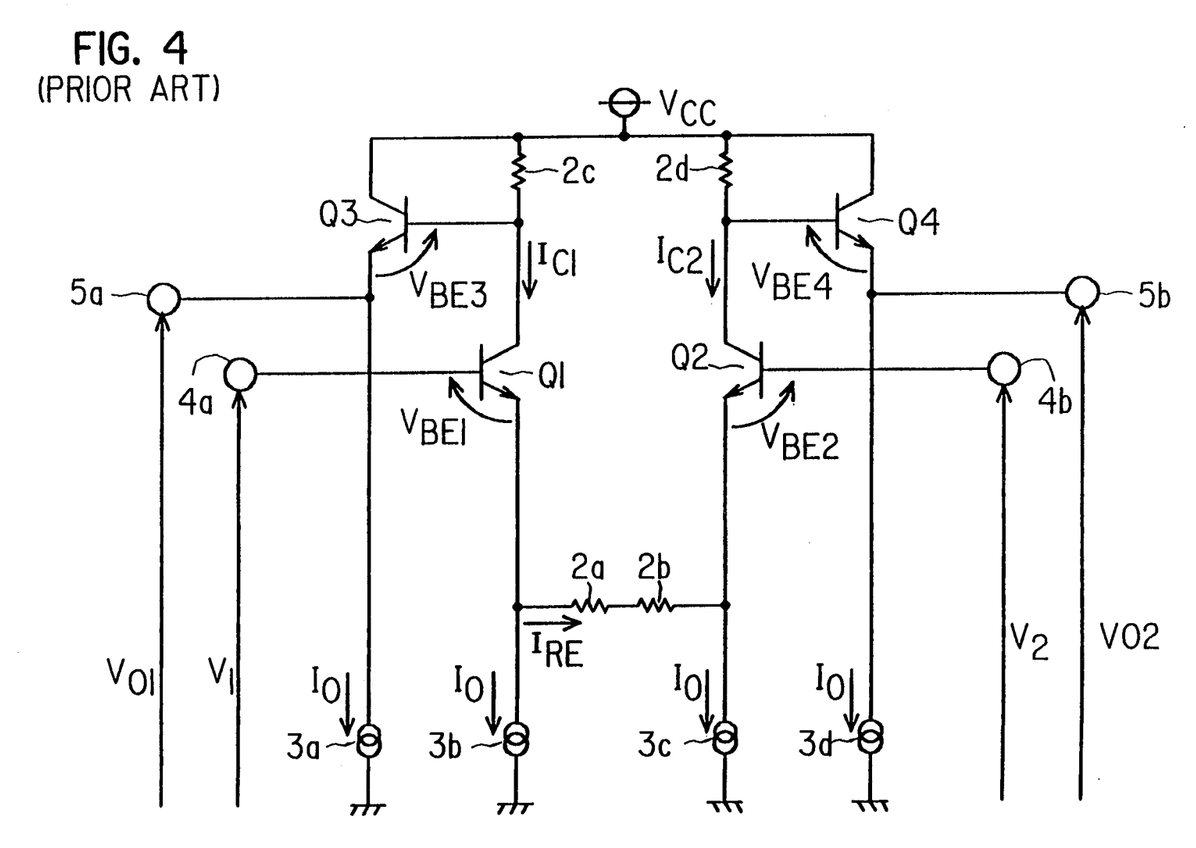
FIG. 4 is a circuit diagram showing an architecture of a prior art differential amplifier.

A differential amplifier used in the A/D converter or the like as illustrated in FIG. 5 will now be described. FIG. 4 is a circuit diagram showing an exemplary differential amplifier in the prior art as described in "Transistor Technology" Dec. 1990, p.512, FIG. 2(a). Referring to FIG. 4, the differential amplifier includes NPN bipolar transistors, Q1 to Q4, emitter resistances 2a and 2b and collector resistances 2c and 2d respectively connected to emitter electrodes and collector electrodes of the NPN bipolar transistors Q1 and Q2, constant current sources, 3a to 3d, for outputting constant current $I_0$, first and second input terminals 4a and 4b receiving input voltage applied to the differential amplifier, and first and second output terminals 5a and 5b of the differential amplifier.

An operation of the differential amplifier will be described below. The differential amplifier amplifies a difference between voltages applied to the first and second input terminals 4a and 4b. For example, assuming that voltage applied to the first input terminal 4a (a base electrode of the NPN bipolar transistor Q1) is $V_1$ and voltage applied to the second input terminal 4b (a base electrode of the NPN bipolar transistor Q2) is $V_2$, output voltages $V_{01}$ and $V_{02}$ from the first and second output terminals 5a and 5b will now be found.

First note the current flowing in portions communicating emitters of the NPN bipolar transistors Q1 and Q2. The input voltages $V_1$ and $V_2$ are reduced by base-emitter voltages $V_{BE1}$ and $V_{BE2}$ of the NPN bipolar transistors Q1 and Q2, respectively. Assuming now that a resistance value of a pair of the emitter resistances 2a and 2b is $R_E$, current $I_{RE}$ expressed in Formula 1 as follows flows in the emitter resistances 2a and 2b:

$$I_{RE} = \{(V_1 - V_{BE1}) - (V_2 - V_{BE2})\}/2R_E \quad (1)$$
$$= \{(V_1 - V_2) - (V_{BE1} - V_{BE2})\}/2R_E$$

Thus, both the current derived from the constant current source and the current caused by the potential difference between the emitter resistances 2a and 2b flow in the emitter electrode of the NPN bipolar transistor Q1; that is, a value of emitter current of the NPN bipolar transistor Q1 can be expressed by $I_0 + I_{RE}$. Also, both the current derived from the constant current source 3c and the current caused by the emitter resistances 2a and 2b flow in the emitter electrode of the NPN bipolar transistor Q2; that is, a value of emitter current of the NPN bipolar transistor Q2 is expressed by $I_0 - I_{RE}$.

Collector currents $I_{C1}$ and $I_{C2}$ of the NPN bipolar transistors Q1 and Q2 are given by the following Formula 2 and Formula 3, assuming that a current amplification factor is $\alpha_0$ (almost equal to 1):

$$I_{C1} = \alpha_0 I_{E1} \approx (I_0 + I_{RE}) \quad (2)$$

$$I_{C2} = \alpha_0 I_{E2} \approx (I_0 - I_{RE}) \quad (3)$$

The output voltages $V_{01}$ and $V_{02}$ are expressed with base-emitter voltages $V_{BE3}$ and $V_{BE4}$ of the NPN bipolar transistors Q3 and Q4 by the following Formula 4 and Formula 5:

$$V_{01} = V_{CC} - R_C I_{C1} - V_{BE3} = V_{CC} - R_C(I_0 + I_{RE}) - V_{BE3} \quad (4)$$

$$V_{02} = V_{CC} - R_C I_{C2} - V_{BE4} = V_{CC} - R_C(I_0 - I_{RE}) - V_{BE4} \quad (5)$$

Herein, however, base currents of the NPN bipolar transistors Q3 and Q4 are ignored. Thus, voltage between the output terminals 5a and 5b of the differential amplifier is expressed in Formula 6:

$$\begin{aligned} V_{01} - V_{02} &= -2R_C I_{RE} - (V_{BE3} - V_{BE4}) \\ &= -R_C/R_E\{(V_1 - V_2) - (V_{BE1} - V_{BE2})\} \\ &\quad - (V_{BE3} - V_{BE4}) \end{aligned} \quad (6)$$

If it is assumed that the NPN bipolar transistors, Q1 to Q4, are all identical in feature although it is an ideal case, and without considering the difference between the collector currents $I_{C1}$ and $I_{C2}$, the base-emitter voltages, $V_{BE1}$ to $B_{BE4}$, are all equivalent to one another, and the difference of the output voltages ($V_{01} - V_{02}$) in such a case is given by the following Formula 7:

$$V_{01} - V_{02} = -R_C/R_E(V_1 - V_2) \quad (7)$$

Thus, it is apparent that the differential amplifier shown in FIG. 4 can amplify the difference between the voltages applied to the two input terminals 4a and 4b with a resistance rate of the collector resistances 2c and 2d to the emitter resistances 2a and 2b.

The prior art differential amplifier configured as mentioned above has disadvantages as discussed below:

The difference of the output voltages ($V_{01} - V_{02}$) as expressed in Formula 7 is obtained under the requirements that the collector currents $I_{C1}$ and $I_{C2}$ are equal to each other and that the transistors are all identical in feature. However, the base-emitter voltage $V_{BE}$ is expressed by a non-linear equation as in Formula 8. "ln" hereinafter represents a natural logarithm.

$$V_{BE} = V_T \ln(I_C/I_S) \quad (8)$$

where $V_T$ is thermoelectric voltage and $I_S$ is saturation current. As can be seen in Formula 6, as the base-emitter voltages, $V_{BE1}$ to $V_{BE4}$, of the NPN bipolar transistors, Q1 to Q4, vary, the difference of the output voltages ($V_{01} - V_{02}$) varies. Thus, a gain (an amplification degree) of the differential amplifier is reduced, and linearity is degraded from the non-linear property of the base-emitter voltage $V_{BE}$. Furthermore, in practice, it is unattainable that all the transistors are identical in feature because of variations in the process of manufacturing them. This also causes the base-emitter voltages, $V_{BE1}$ to $V_{BE4}$, to vary from one to another.

Figure 6A:
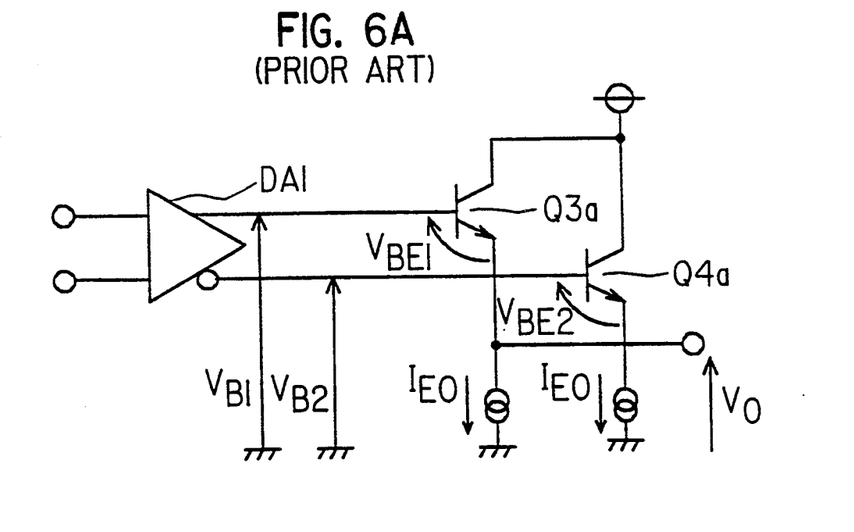
FIG. 6 is a circuit diagram showing architectures of differential amplifiers used in the prior art two-step parallel A/D converter.
Figure 6B:
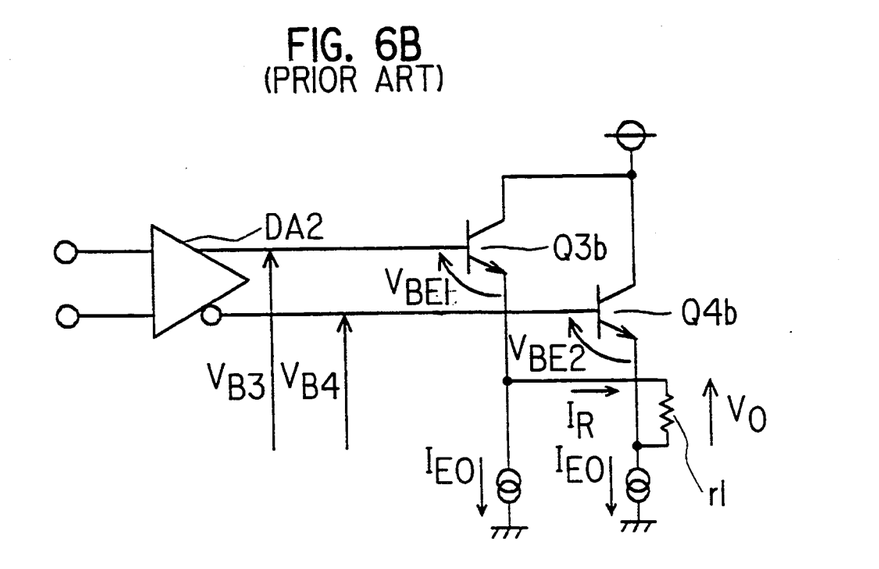

The prior art two-step parallel A/D converter configured as mentioned above has disadvantages as follows:

FIG. 6 is a circuit diagram showing the first and second differential amplifiers 11c and 11b constituting the A/D converter shown in FIG. 5. FIG. 6(a) depicts the first differential amplifier 11c which is an input stage of a fine A/D converting unit, and FIG. 6(b) depicts the second differential amplifier 11b which is a reference stage of the fine A/D converting unit. Referring to FIG. 6, the differential amplifiers include differential amplifying elements DA1 and DA2, NPN bipolar transistors, Q3a, Q3b, Q4a and Q4b, constituting emitter followers, and a resistance r1. The NPN bipolar transistors, Q3a, Q3b, Q4a and Q4b, have their respective collector electrodes connected to power sources and their respective emitter electrodes connected to constant current sources for outputting constant current $I_{EO}$. In the differential amplifiers, base-emitter voltages of the above transistors, namely, $V_{be1}$ of each of the NPN bipolar transistors Q3a and Q3b, and $V_{be2}$ of each of the NPN bipolar transistors Q4a and Q4b, are given by Formulas 9, 10 and 11 as follows:

Input Stage: $V_{be1} = V_T \ln(\alpha I_{EO}/I_S)$ (9)

Reference Stage: $V_{be1} = V_T \ln\{\alpha(I_{EO}+I_R)/I_S\}$ (10)

$V_{be2} = V_T \ln\{\alpha(I_{EO}-I_R)/I_S\}$ (11)

where $\alpha$ is a current amplification factor and $I_{EO}$ is a value of current flowing in the constant current sources. Hence, output voltage $V_O$ of the first and second differential amplifiers 11c and 11b are given by the following Formula 12 and Formula 13:

Input Stage:
$V_0 = V_{b1} - V_{be1} = Va - V_{be1} + V_{b2}(Va = V_{b1} - V_{b2})$ (12)
Reference Stage:
$V_0 =$ (13)
$V_{b3} - V_{b4} - V_{be1} + V_{be2} = Vb - V_{be1} + V_{be2}(Vb = V_{b3} - V_{b4})$ As can be seen, the output voltage $V_O$ varies from the input stage to the reference stage; that is, comparing the left side of Formula 13 with that of Formula 12, it will be recognized that they include different terms $V_{b2}$ and $V_{be2}$ from each other. Thus, errors are caused in the outputs for different reasons. In comparing the voltage from the input stage (the output voltage from the first differential amplifier 11c) with the voltage from the output stage (the output voltage from the second differential amplifier 11b) by the comparators of the fine A/D converting unit, sometimes there arises the problem of mismatch; i.e., those which are different in output range are compared.

SUMMARY OF THE INVENTION

According to the present invention, in a first aspect of the present invention, a differential amplifier comprises first and second input terminals receiving input signals thereon; a differential amplifying element including a pair of first and second transistors for differential operation having their respective control electrodes connected to the first and second input terminals for producing first and second outputs and their respective first and second electrodes; an output element which includes third and fourth transistors having their respective first, second and control electrodes and receiving the first and second outputs from the differential amplifying element on the respective control electrodes of the third and fourth transistor and then buffering the first and second outputs to output them; fifth and sixth transistors having their respective emitter and collector electrodes and their respective base electrodes connected to the first and second input terminals and connecting in series to the third and fourth transistors respectively; and a resistance connected between the emitter electrodes of the fifth and sixth transistors.

In the first aspect of the present invention, the fifth and sixth transistors and the resistance connected between the emitter electrodes of the fifth and sixth transistors adjust the collector currents of the third and fourth transistors in response to the input, thereby compensating variations in base-emitters voltages of the third and fourth transistors.

As has been described, in the first aspect of the present invention, a differential amplifier is comprised of fifth and sixth transistors having their respective control electrodes connected to first and second input terminals and serially connected to third and fourth transistors, and resistance means connected between emitters of the fifth and sixth transistors. Hence, effectively variations in base-emitter voltages of the third and fourth transistors can be compensated, and a gain of the differential amplifier and linearity of its output can be improved.

In a second aspect of the present invention, a two-step parallel A/D converter converting the analog signal into a digital signal separated into specified high-order digits and remaining low-order digits comprises a coarse A/D converting unit receiving an analog signal for performing A/D conversion of the specified high-order digits; a first differential amplifier having first and second input terminals and first and second output terminals and receiving the analog signal in the first input terminal for outputting a fine A/D conversion analog signal from one of the first and second output terminals; a second differential amplifier having first and second input terminals and first and second output terminals for outputting a fine A/D conversion reference voltage from the first and second output terminals; a fine A/D converting unit having a plurality of resistances connected in series between the first and second output terminals of the second differential amplifier and comparing voltage developed by the plurality of resistances with the fine A/D conversion analog signal output from the first differential amplifier for performing A/D conversion of the remaining low-order digits; and first resistance means connected between the first and second output terminals of the first differential amplifier.

The resistance means connected between the first and second output terminals of the first differential amplifier in accordance with the second aspect of the present invention has an approximate resistance value to the total resistance value of a plurality of resistances connected in series to the first and second output terminals of the second differential amplifier when, for example, the first and second differential amplifiers have the same architectures. Therefore, factors causing errors in the first and second differential amplifiers, such as a way of causing errors by variation in base-emitter voltages of transistors constituting the first and second differential amplifiers, exert the same influences.

In the second aspect of the present invention, since a differential amplifier includes resistance means connected to first and second output terminals of a first differential amplifier, factors causing errors in the first and second differential amplifiers exert the same influences, and thus, an accuracy of a two-step parallel A/D converter can be enhanced.

Preferably, in the two-step parallel A/D converter, at least one of the first and second differential amplifiers includes: first and second input terminals receiving input signals thereon; a differential amplifying element which includes a pair of first and second transistors for differential operation having their respective control electrodes connected to the first and second input terminals, for producing first and second outputs and their respective first and second electrodes; an output element having third and fourth transistors having their respective first, second and control electrodes and receiving the first and second outputs from the differential amplifying element on the respective control electrodes of the third and fourth transistors and buffering the first and second outputs to output them; fifth and sixth transistors having their respective emitter and collector electrodes and their respective base electrodes connected to the first and second input terminals and connecting serially to the third and fourth transistors; and a resistance connected between the emitter electrodes of the fifth and sixth transistors.

In the first and second differential amplifiers in accordance with a third aspect of the present invention, the fifth and sixth transistors and the resistance connected between the emitter electrodes of the fifth and sixth transistors adjust the collector currents of the third and fourth transistors in response to the input, thereby compensating variations in base-emitters voltages of the third and fourth transistors.

In the third aspect of a differential amplifier of the present invention, since at least one of first and second differential amplifiers includes fifth and sixth transistors having their respective control electrodes connected to first and second input terminals and serially connected to third and fourth transistors and resistance means connected between emitters of the fifth and sixth transistors, a gain of the differential amplifier and linearity of its output can be improved, and an accuracy of a two-step parallel A/D converter can be further enhanced.

Preferably, in the two-step parallel A/D converter, a resistance value of the first resistance means is equal to the total resistance value of the plurality of resistances connected in series to the first and second output terminals of the second differential amplifier.

By the resistance means connected between the first and second output terminals of the first differential amplifier in accordance with the fourth aspect of the present invention, factors causing errors in the first and second differential amplifiers, such as a way of causing errors by variation in base-emitter voltages of transistors constituting the first and second differential amplifiers, exert the same influences.

In the fourth aspect of a differential amplifier of the present invention, since a resistance value of resistance means is equal to the total resistance value of a plurality of resistances serially connected to first and second output terminals of a second differential amplifier, factors causing errors in the first and second differential amplifiers exert the same influences, and an accuracy of a two-step parallel A/D converter can be enhanced.

Accordingly, it is an object of the present invention to let factors of variations in outputs from differential amplifiers in a two-step parallel A/D converter from each other be equal so as to enhance an accuracy of A/D conversion. It is another object of the present invention to let variations in base-emitter voltages $V_{BE}$ of transistors from one another be small in the differential amplifiers used in the two-step parallel A/D converter to enhance an accuracy of the difference of output voltages ($V_{O1} - V_{O2}$), so that linearity of the differential amplifiers can be improved and that reduction of a gain of each differential amplifier can be prevented.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 1:
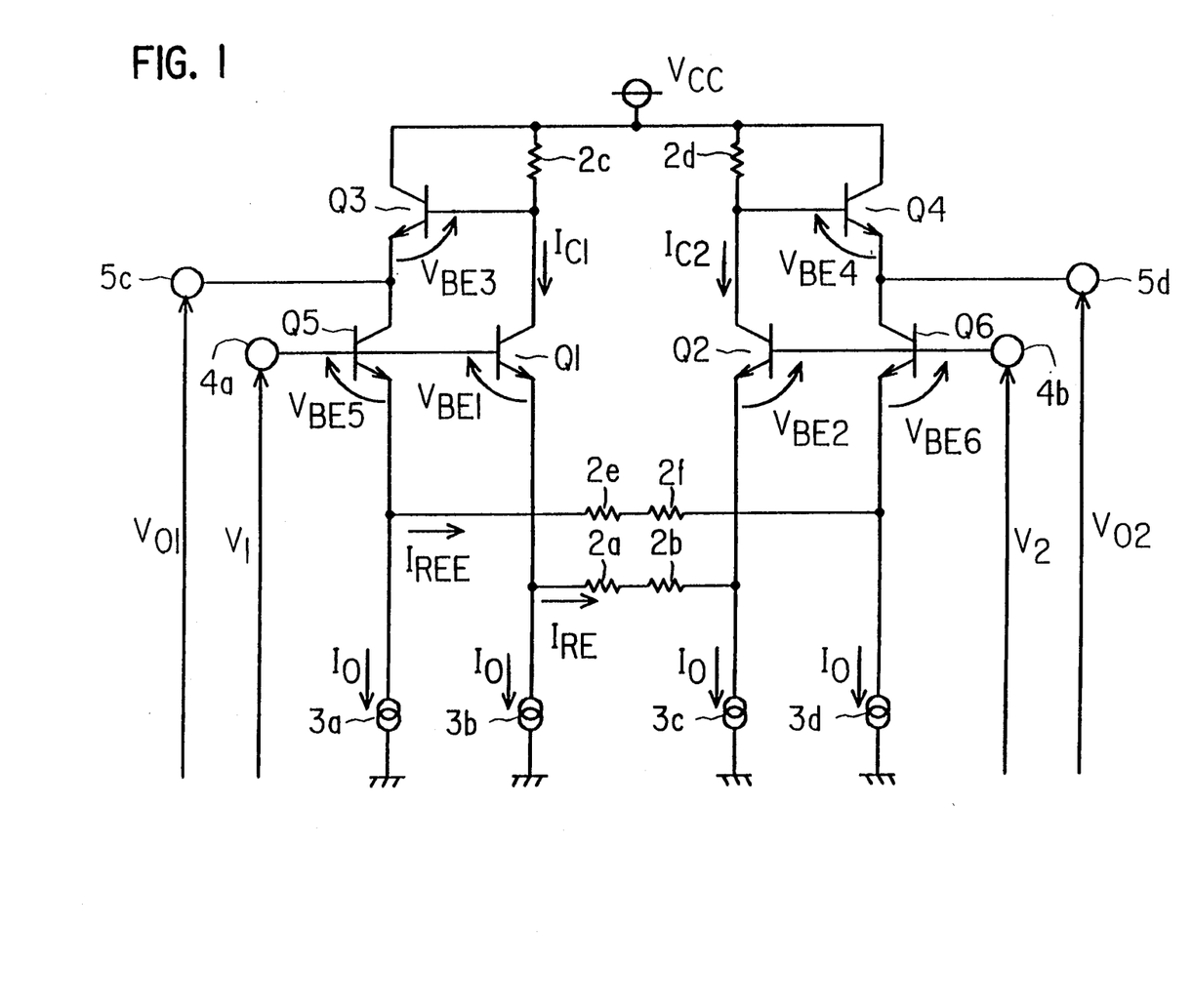
FIG. 1 is a circuit diagram showing an architecture of a differential amplifier of a first preferred embodiment according to the present invention.

A first preferred embodiment of the present invention will now be described. FIG. 1 is a circuit diagram showing an architecture of a differential amplifier of the first preferred embodiment according to the present invention. Referring to FIG. 1, the differential amplifier includes NPN bipolar transistors Q5 and Q6, resistances 2e and 2f, and output terminals 5c and 5d; reference numerals other than the above identical to those in FIG. 4 denote components identical or equivalent to those in FIG. 4. The differential amplifier shown in FIG. 1 is different from that shown in FIG. 4 in that the NPN bipolar transistors Q5 and Q6 are serially interposed between emitter followers of output stages, and the resistances 2e and 2f interconnect emitters of the NPN bipolar transistors Q5 and Q6.

Functions of the NPN bipolar transistors Q5 and Q6, and those of the resistances 2e and 2f will be described. Since collector current of the transistor Q5 and that of the transistor Q3 are almost equal while collector current of the transistor Q6 and that of the transistor Q4 are almost equal, base-emitter voltages $V_{BE}$ of the transistors Q3 and Q5 are equal to each other while those of the transistors Q4 and Q6 are equal to each other; that is, $V_{BE3} = V_{BE5}$ and $V_{BE4} = V_{BE6}$. The difference of output voltages ($V_{O1} - V_{O2}$) is given by the following Formula 14:

$$V_{O1} - V_{O2} = -R_C/R_E\{(V_1 - V_2) - (V_{BE2})\} - (V_{BE3} - V_{BE4}) \quad (14)$$
$$= -R_C/R_E\{(V_1 - V_2) - (V_{BE2})\} - (V_{BE5} - V_{BE6})$$

A case whom input voltages $V_1$ and $V_2$ are equal will be discussed below. Emitter currents of the transistors Q1, Q2, Q5 and Q6 are all equal to current $I_O$ flowing in constant current sources, 3a to 3d, and therefore, the base-emitter voltages $V_{BE}$ of those transistors are all equal.

$$V_{BE1} = V_{BE2} = V_{BE5} = B_{BE6} = V_{BE} = V_T \ln(I_0/I_S) \quad (15)$$

Then, a case where the input voltages $V_1$ and $V_2$ differ from each other will be discussed. For example, when $V_1 > V_2$, voltage equivalent to the difference between those input voltages is applied to opposite ends of a pair of the resistances 2a and 2b serially connected between emitters of the transistors Q1 and Q2 and a pair of the resistances 2e and 2f serially connected between emitters of the transistors Q5 and Q6. Accordingly, currents $I_{RE}$ and $I_{REE}$ flow. The currents $I_{RE}$ and $I_{REE}$ cause the base-emitter voltages $V_{BE}$ of the transistors Q1, Q2, Q5 and Q6 to vary form each other. Assuming that a variation is $\Delta V_{BE}$, the collector currents of the transistors Q1 and Q5 increase in accordance with the variation $\Delta V_{BE}$ while the collector currents of the transistors Q2 and Q6 decrease in accordance with the variation $\Delta V_{BE}$, the currents $I_{RE}$ and $I_{REE}$ are given by Formula 16 and Formula 17 as follows:

$$I_{RE} = [\{V_1 - (V_{BE} + \Delta V_{BE})\} - \{V_2 - (V_{BE} - \Delta V_{BE})\}]/2R_E \quad (16)$$
$$= \{(V_1 - V_2) - 2\Delta V_{BE}\}/2R_E$$

$$I_{REE} = [\{V_1 - (V_{BE} + \Delta V_{BE})\} - \{V_2 - (V_{BE} - \Delta V_{BE})\}]/2R_{EE} \quad (17)$$
$$= \{(V_1 - V_2) - 2\Delta V_{BE}\}/2R_{EE}$$

When the relation between the input voltages $V_1$ and $V_2$ is $V_1 < V_2$, the collector currents of the transistors Q1 and Q5 decrease in accordance with the variation $\Delta V_{BE}$ while the collector currents of the transistors Q2 and Q6 increase in accordance with the variation $\Delta V_{BE}$, and therefore, the currents $I_{RE}$ and $I_{REE}$ are given by Formula 18 and Formula 19 as follows:

$$I_{RE} = -\{(V_1 - V_2) + 2\Delta V_{BE}\}/2R_E \quad (18)$$

$$I_{REE} = -\{(V_1 - V_2) + 2\Delta V_{BE}\}/2R_{EE} \quad (19)$$

When the relation between the input voltages $V_1$ and $V_2$ is $V_1 > V_2$, the base-emitter voltages $V_{BE1}$, $V_{BE2}$, $V_{BE5}$ and $V_{BE6}$ of the transistors Q1, Q2, Q5 and Q6 are expressed by Formulas 20, 21, 22 and 23 as follows:

$$V_{BE1} = V_T \ln\{(I_0 + I_{RE})/I_S\} \quad (20)$$

$$V_{BE2} = V_T \ln\{(I_0 - I_{RE})/I_S\} \quad (21)$$

$$V_{BE5} = V_T \ln\{(I_0 + I_{REE})/I_S\} \quad (22)$$

$$V_{BE6} = V_T \ln\{(I_0 - I_{REE})/I_S\} \quad (23)$$

When an amplification degree (gain) of the differential amplifier is 1, that is, when a resistance value of a pair of the resistances 2a and 2b and that of a pair of the resistances 2c and 2d are equal to each other ($R_C = R_E$), the difference of the output voltages ($V_{01} - V_{02}$) is obtained according to Formula 14 as expressed in the following Formula 24:

$$V_{01} - V_{02} = -(V_1 - V_2) + (V_{BE1} - V_{BE2}) - (V_{BE3} - V_{BE4}) \quad (24)$$
$$= -(V_1 - V_2) + (V_{BE1} - V_{BE2}) - (V_{BE5} - V_{BE6})$$
$$= -(V_1 - V_2) + (V_{BE1} - V_{BE5}) - (V_{BE2} - V_{BE6})$$

In this case, if the resistance values of the resistance pairs, 2a–2b and 2e–2f, are the same ($R_{EE} = R_E$) in Formulas 16, 17, 18 and 19, currents flowing in the resistance pairs, 2a–2b and 2e–2f, are the same ($I_{RE} = I_{REE}$). Accordingly, the base-emitter voltages $V_{BE1}$ and $V_{BE5}$ of the NPN bipolar transistors Q1 and Q5 are equal to each other while the base-emitter voltages $V_{BE2}$ and $V_{BE6}$ of the NPN bipolar transistors Q2 and Q6 are equal to each other. Thus, with the $V_{BE1} = V_{BE5}$, $V_{BE2} = V_{BE6}$, and Formula 24, the difference between the output voltages ($V_{01} - V_{02}$) is given by the following Formula 25, and there is no influence of the base emitter voltages $V_{BE}$ of the transistors, Q1 to Q6:

$$V_{01} - V_{02} = -(V_1 - V_2) \quad (25)$$

Then, if the amplification degree of the differential amplifier is not 1 ($R_C = AR_E$, $A \neq 1$), the difference between the output voltages ($V_{01} - V_{02}$) is given by Formula 26 as follows:

Thus, if the amplification degree is more than 1 ($A > 1$), that is, if the resistance value of the pair of the resistances 2a and 2b is larger than that of the pair of the resistances 2c and 2d ($R_C > R_E$), in the event of the resistance value of the pair of the resistances 2e and 2f less than that of the pair of the resistances 2a and 2b ($R_{EE} < R_E$), the current flowing in the resistances 2a and 2b is larger than the current flowing in the resistances 2e and 2f ($I_{RE} < I_{REE}$), and as a result, the base-emitter voltages can be adjusted to satisfy $V_{BE1} < V_{BE5}$, and $V_{BE2} < V_{BE6}$. Thus, influences of the transistors Q1 to Q6 ($AV_{BE1} - V_{BE5}$, $AV_{BE2} - V_{BE6}$) can be relieved.

When the amplification degree is less than 1 ($A < 1$), that is, if the resistance value of the pair of the resistances 2a and 2b is smaller than that of the pair of the resistances 2c and 2d ($R_C < R_E$), in the event of the value of the resistances 2e and 2f more than the value of the resistances 2a and 2b in Formulas 16 to 19 ($R_{EE} < R_E$), the current flowing in the resistances 2a and 2b is smaller than the current flowing in the resistances 2e and 2f ($I_{RE} > I_{REE}$), and as a result, the values, $AV_{BE1} - V_{BE5}$ and $AV_{BE2} - V_{BE6}$, can be adjusted to satisfy $V_{BE1} > V_{BE5}$, and $V_{BE2} > V_{BE6}$. Thus, the influences of the transistors Q1 to Q6 ($AV_{BE1} - V_{BE5}$, $AV_{BE2} - V_{BE6}$) upon the difference between the output voltages ($V_{01} - V_{02}$) can be relieved.

Figure 2:
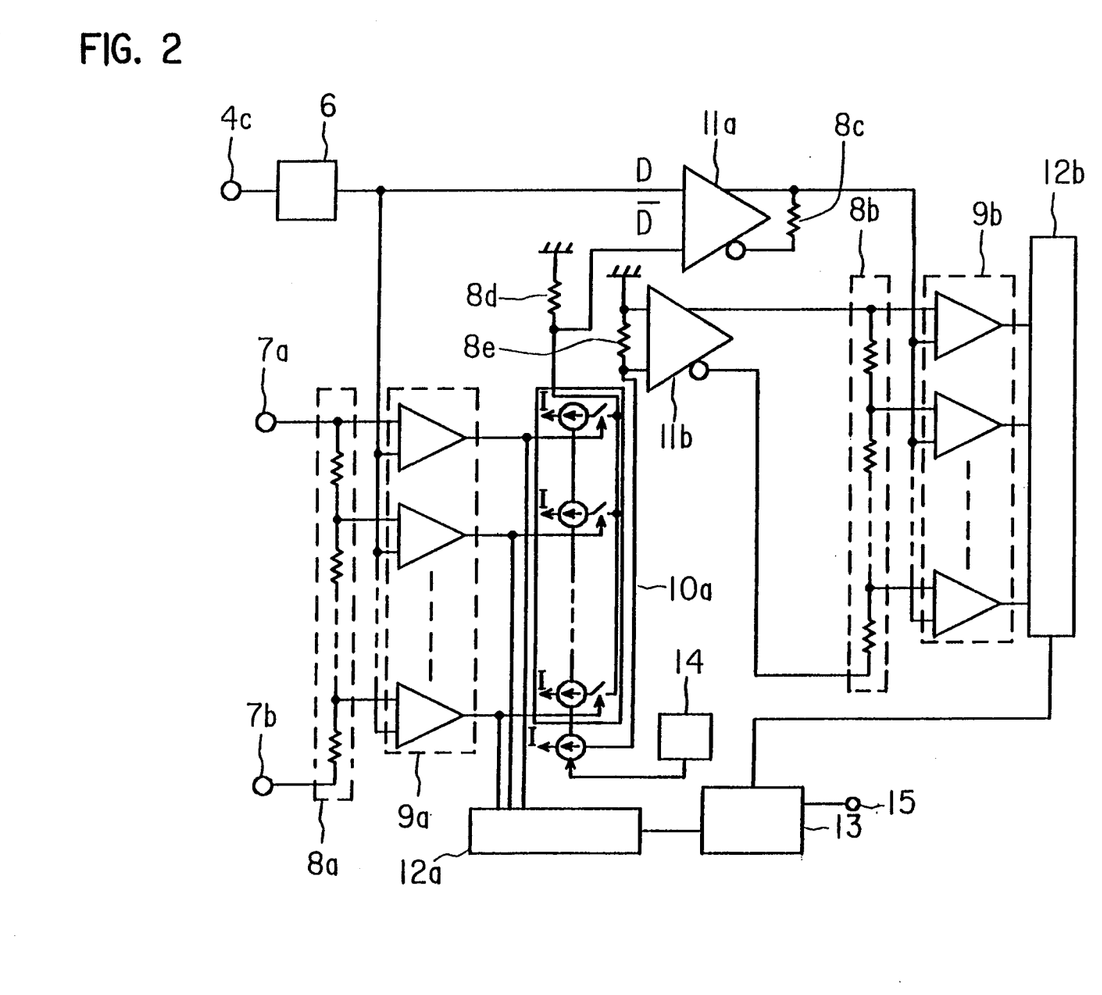
FIG. 2 is a block diagram showing an architecture of a two-step parallel A/D converter of a second preferred embodiment according to the present invention.

Then, a two-step parallel A/D converter of a second preferred embodiment according to the present invention will be described with reference to FIG. 2. FIG. 2 is a block diagram showing an architecture of the two-step parallel A/D converter of the second preferred embodiment of the present invention. Referring to FIG. 2, the two-step parallel A/D converter includes a resistance 8c connected between first and second output terminals of a differential amplifier 11a, and a reference generating circuit 14 for determining a current value of a current source 16 or the like; and like reference numerals other than the above identical to those in FIG. 5 denote components identical or corresponding to those in FIG. 5.

Then, an operation of the A/D converter shown in FIG. 2 will be described. The A/D converter includes a coarse A/D converting unit for performing A/D conversion of high-order digits and a fine A/D converting unit for performing A/D conversion of low-order digits, which is a two-step parallel A/D converter for performing A/D conversion of an analog input signal twice to convert it into a digital signal.

An analog signal received on a input terminal 4c is sampled and then held by a S/H circuit 6. The analog signal D held by the S/H circuit 6 is transmitted to comparators of a comparator group 9a. Coarse A/D conversion reference voltage applied to reference voltage terminals 7a and 7b is transmitted to each comparator of the comparator group 9a after divided by a group 8a of resistances. In each comparator of the comparator group 9a, the first comparison of the divided coarse A/D conversion reference voltage with the analog signal D is performed, and a result of the comparison is transferred to an encoder circuit 12a and a D/A converter 10a. The encoder circuit 12a encodes a digital signal of high-order digits to output it to an adder 13. The digital signals of the high-order digits input from the comparators to the D/A converter 10a allow switches to turn on so as to connect current sources. In response to it, a current value I is added for each connected current source so that the digital signal of the high-order digits is converted into an analog signal $\overline{D}$ depending upon the sum of current values and a resistance value of a resistance 8d, and the analog signal $\overline{D}$ is transmitted to the first differential amplifier 11a serving as a subtracter. Simultaneously permitting current to flow in an input of a second differential amplifier 11b in accordance with a result of coarse A/D conversion, reference voltage for fine A/D conversion can be developed at opposite ends of a group 8b of resistances.

In the first differential amplifier 11a, subtraction between the analog signal D output from the S/H circuit 6 and an analog signal D2 output from the D/A converter 10a is performed. The difference voltage obtained by the subtraction between the analog signal D and the analog signal $\overline{D}$ is transmitted to the fine A/D converting element, and thus, the second comparison is performed; specifically, the difference voltage output from a first output terminal of the first differential amplifier 11a is transmitted to a group 9b of comparator and input to a first terminal of each comparator. The reference voltage for fine A/D conversion output from the second differential amplifier 11b is divided by the resistance group 8b and then input to a second terminal of each comparator of the comparator group 9b. Each comparator of the comparator group 9a compares the divided fine A/D conversion reference voltage with the difference voltage, and a result of comparison is transmitted to an encode circuit 12b. The result of the comparison by the comparator group 9b is converted into digital data by the encoder circuit 12b and output to an adder 13. The adder 13 adds output data from both the coarse and fine A/D converting units and corrects a result to obtain a desired digital output. In this second preferred embodiment, for example, the resistances 8d and 8e respectively connected directly to inputs of the differential amplifiers 11a and 11b are equalized, and a current source equivalent to that for the differential amplifier 11a is connected to the differential amplifier 11b. By virtue of the above arrangement, an output range of the differential amplifier 11b is the same with an output range of the differential amplifier 11a.

The second preferred embodiment as illustrated in FIG. 2 is different from the prior art two-step parallel A/D converter as illustrated in FIG. 5 in that a resistance 8c having a resistance value equal to the total resistance value of the resistance group 8b connected to the output terminal of the differential amplifier 11b at the reference stage is connected to an output terminal of the differential amplifier 11a at the input stage.

Figure 7:
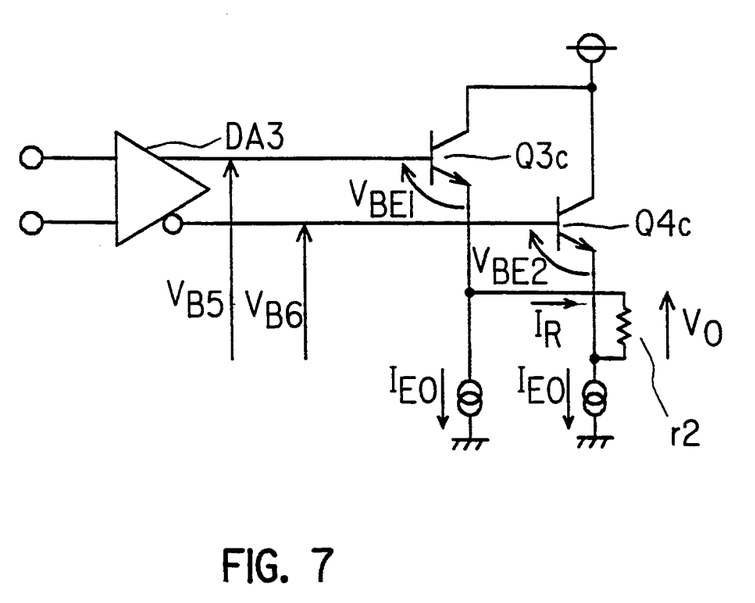
FIG. 7 is a circuit diagram showing an architecture of a differential amplifier used in the two-step parallel A/D converter shown in FIG. 2.

With reference to FIGS. 6 and 7, it will be explained that any influence caused by mismatch in the reference stage is eliminated in the two-step parallel A/D converter as illustrated in FIG. 2. FIG. 7 is a circuit diagram showing an architecture of the differential amplifier 11a as illustrated in FIG. 2. In FIG. 7, the differential amplifier 11a includes a differential amplifying element DA3, NPN bipolar transistors Q3c and Q4c constituting an emitter follower, and a resistance r2. The NPN bipolar transistors Q3c and Q4c have their respective collector electrodes connected to a power source and their respective emitter electrodes connected to a constant current source outputting constant current $I_{E0}$. In the differential amplifier, base-emitter voltage $V_{be1}$ of the NPN bipolar transistor Q3c and base-emitter voltage $V_{be2}$ of the NPN bipolar transistor Q4c are given by Formula 10 and Formula 11. Now, output voltages $V_O$ from the differential amplifier 11a at the input stage and the differential amplifier 11b at the reference stage as expressed by Formulas 27 and 28, respectively, will be compared:

Reference Stage:
$$V_0 = V_b - V_{be1} + V_{be2}(V_c = V_{b5} - V_{b6}) \quad (28)$$
Input Stage:
$$V_0 = (V_{b5} - V_{be1}) - \quad (27)$$

$$(V_{b6} - V_{be2}) = (V_{b5} - V_{b6}) - v_{be1} + V_{be2} = V_c - V_{be1} + V_{be2}$$

As will be recognized, since the second and third terms of both the Formulas 27 and 28 are equal and the first terms simply represent output voltages of differential amplifying elements DA2 and DA3, the input stage and the reference stage are identical in parameters of their respective output voltages $V_O$. Thus, even if outputs and base-emitter voltages in the differential amplifying elements vary, for example, there arise no mismatch between the differential amplifiers 11a and 11b.

Figure 3:
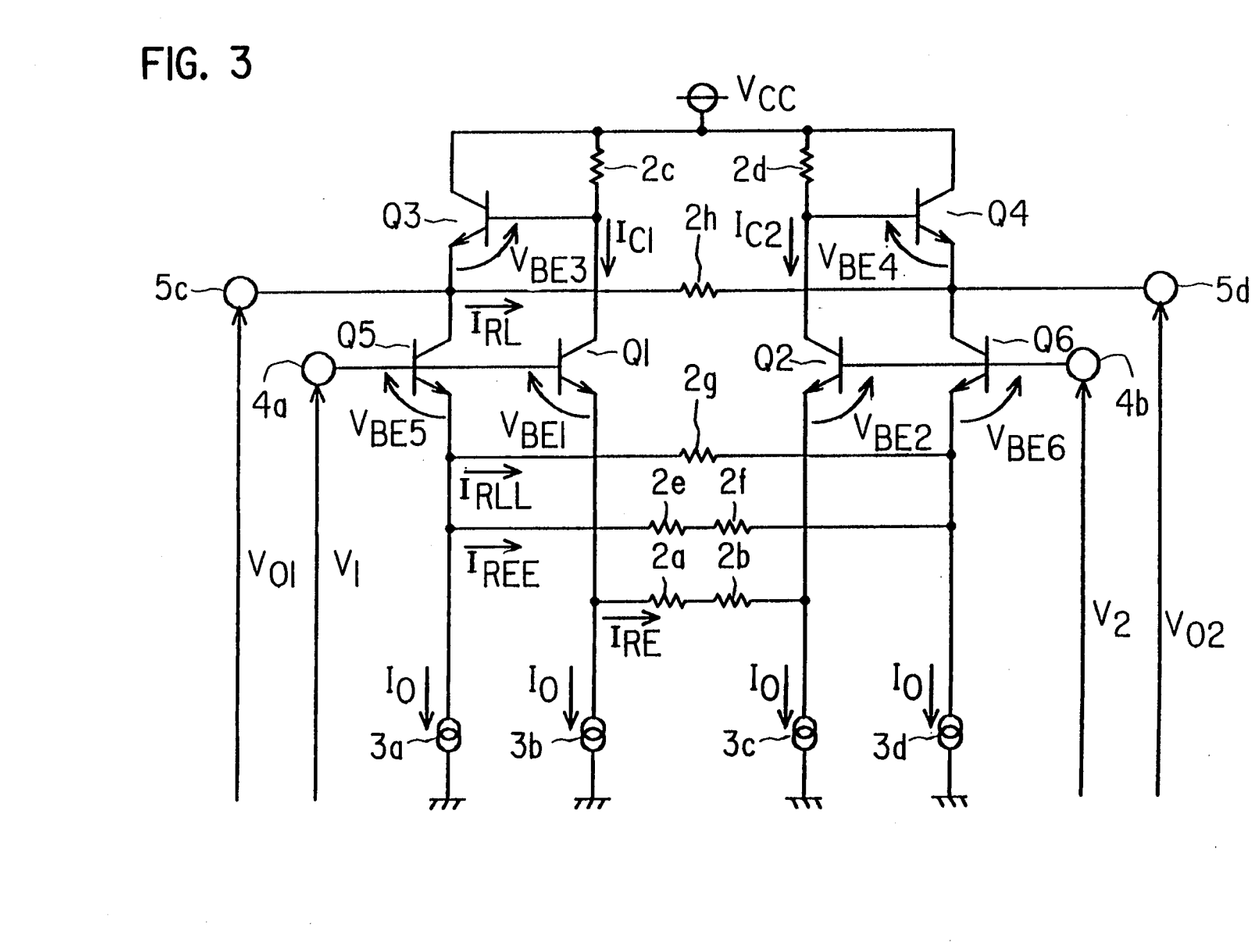
FIG. 3 is a circuit diagram showing an architecture of a differential amplifier of a third preferred embodiment according to the present invention.

Then, a two-step parallel A/D converter of a third preferred embodiment according to the present invention will be described with reference to FIG. 3. FIG. 3 is a circuit diagram showing an architecture of the differential amplifiers 11 a and 11b in the second preferred embodiment. Circuitry shown in FIG. 3 includes a resistance 2g connected between emitters of transistors Q5 and Q6 and having a resistance value $R_{LL}$ and a resistance 2h connected between emitters of transistors Q3 and Q4 and having a resistance value $R_L$; reference numerals other than the above identical to those in FIG. 1 denote components identical or corresponding to those in FIG. 1. The differential amplifier illustrated in FIG. 3 differs from the differential amplifier illustrated in FIG. 1 in that the resistance 2h is connected between output terminals 5c and 5d of the differential amplifier and that the resistance 2g is connected between the emitters of the transistors Q5 and Q6. This is a required arrangement in the event of applying the differential amplifier described in the first preferred embodiment to the two-step parallel A/D converter illustrated in the second preferred embodiment, and it will be described below.

Assuming that current which flows in the resistance 2h connected between the output terminals 5c and 5d is $I_{RL}$, the current $I_{RL}$ is given by the following formula 29:

$$I_{RL} = (V_{01} - V_{02})/R_L \quad (29)$$

The base-emitter voltages $V_{BE5}$ and $V_{BE6}$ of the transistors Q5 and Q6 vary; for example, the former decreases and the latter increases as expressed by Formula 30 and Formula 31 as follows:

$$V_{BE5} = V_T \ln\{(I_{C5} - I_{RL})/I_S\} \tag{30}$$

$$V_{BE6} = V_T \ln\{(I_{C6} + I_{RL})/I_S\} \tag{31}$$

Thus, in order to correct variations in the base-emitter voltages, the emitter currents of the transistors Q5 and Q6 may be increase and decrease by $I_{RL}$, respectively. For that purpose, the resistance 2h is newly connected in series to the pair of the resistances 2e and 2f already serially connected so as to obtain the total resistance value $2R_{EE}//R_{LL}$ ($=R_{EL}$) between the emitters. The current $I_{RL}$ flowing in the resistances 2e, 2f and 2g and the resistance value $R_{EL}$ are expressed by Formula 32 and Formula 33, respectively:

$$I_{RL} = \{(V_1 - V_2) - (V_{BE5} - V_{BE6})\}/R_{EL} \tag{32}$$

$$R_{EL} = 2R_{EE}//R_{LL} = (2R_{EE} \cdot R_{LL})/(2R_{EE} + R_{LL}) \tag{33}$$

Then, solving Formulas 32 and 33 for $R_{LL}$, Formula 34 as follows is obtained:

$$1/R_{LL} = I_{RL}/\{(V_1 - V_2) - (V_{BE5} - V_{BE6})\} - \tfrac{1}{2}R_{EE} \tag{34}$$

The resistance 2h which has the resistance value $R_{LL}$ satisfying Formula 34 is connected in series to the pair of the resistance 2e and 2g. In this way, the emitter currents of the transistors Q5 and Q6 is helpful to correct the increasing and increasing variations in the outputs.

Figure 8:
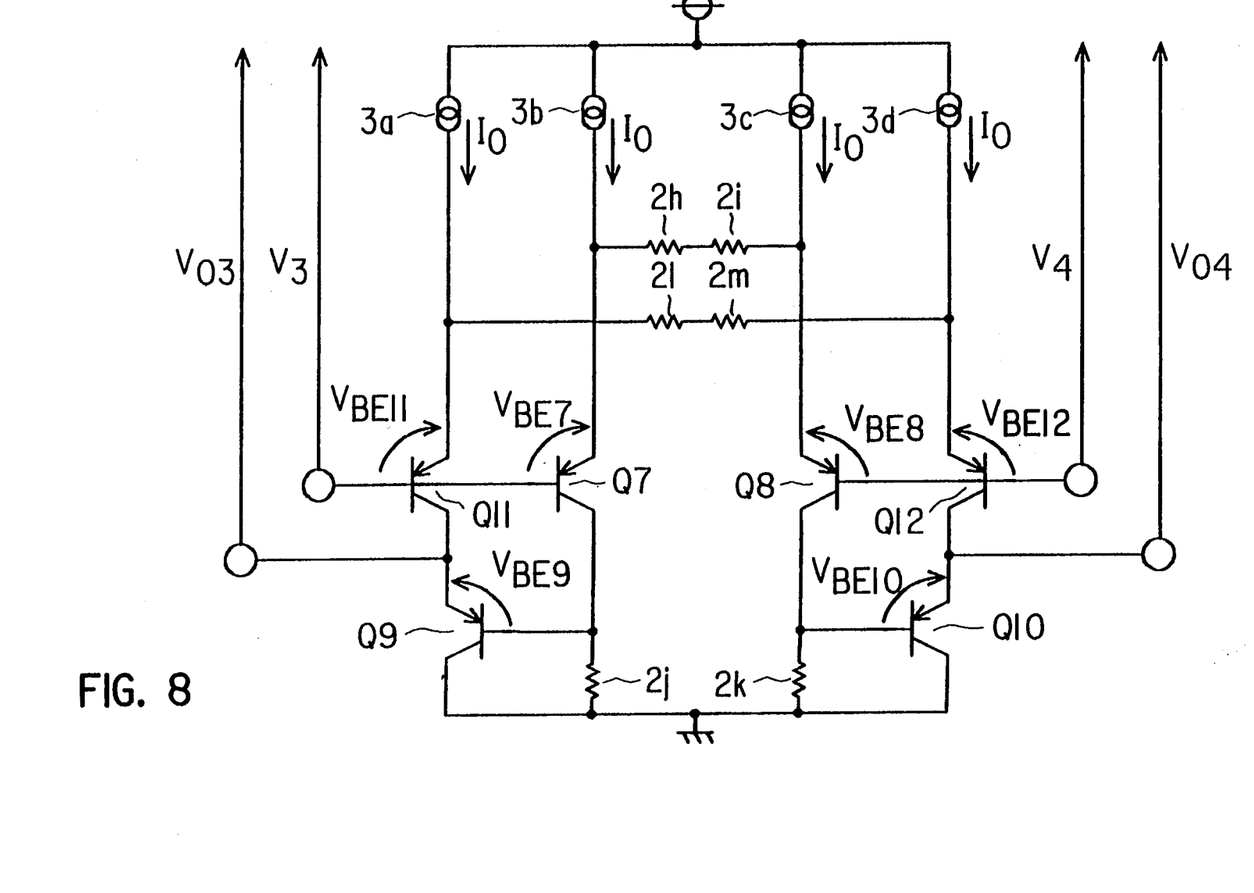
FIG. 8 is a circuit diagram showing an architecture of another differential amplifier of the first preferred embodiment according to the present invention.
Figure 9:
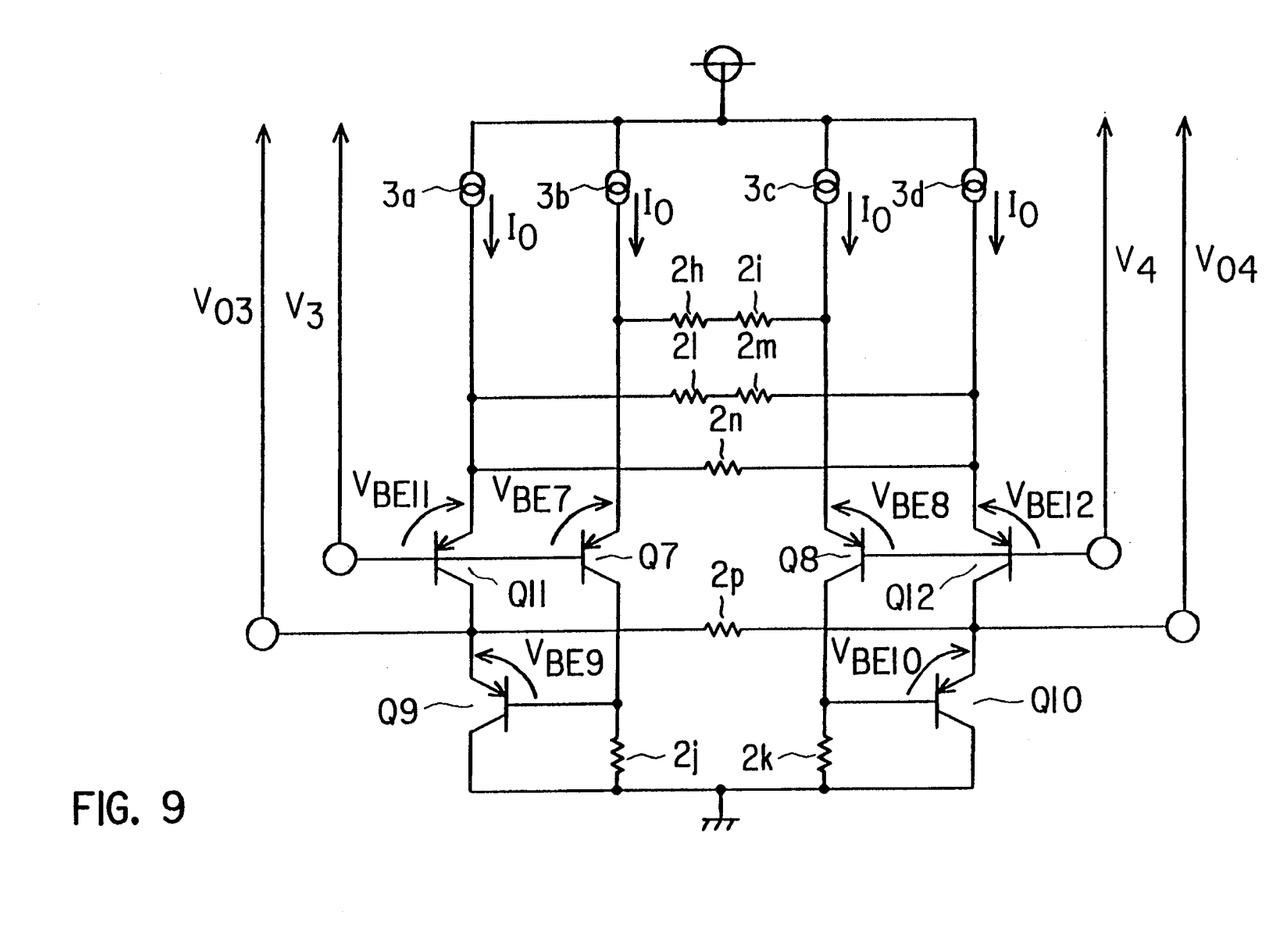
FIG. 9 is a circuit diagram showing an architecture of another differential amplifier of the third preferred embodiment according to the present invention.

While cases where the NPN bipolar transistors Q1 to Q6 are used have been described in the preferred embodiments previously stated, PNP bipolar transistors Q7 to Q12 may be alternatives to them as shown in FIGS. 8 and 9, and they are effective to attain the same features as in the above embodiments.

While the invention has been shown and described in detail, the foregoing description is in all aspects illustrative and not restrictive. It is therefore understood that numerous modifications and variations can be devised without departing from the scope of the invention.

What is claimed is:

1. A two-step parallel A/D converter converting the analog signal into a digital signal separated into specified high-order digits and remaining low-order digits, comprising:
   a coarse A/D converting unit receiving an analog signal for performing A/D conversion of said specified high-order digits;
   a first differential amplifier having first and second input terminals and first and second output terminals and receiving said analog signal in said first input terminal for outputting a fine A/D conversion analog signal from one of said first and second output terminals;
   a second differential amplifier having first and second input terminals and first and second output terminals for outputting a fine A/D conversion reference voltage from said first and second output terminals;
   a fine A/D converting unit having a plurality of resistances connected in series between said first and second output terminals of said second differential amplifier and comparing voltage developed by said plurality of resistances with said fine A/D conversion analog signal output from said first differential amplifier for performing A/D conversion of said remaining low-order digits; and
   first resistance means connected between said first and second output terminals of said first differential amplifier.

2. The two-step parallel A/D converter of claim 1, further comprising:
   a D/A converting unit receiving an output from said coarse A/D converting unit for performing D/A conversion of the output of said A/D converting unit to output an analog signal having the value of high-order digits of the digital signal to said second differential amplifier.

3. The two-step parallel A/D converter of claim 2, further comprising:
   a sample-hold circuit connected to said coarse A/D converting unit and said first terminals of said first differential amplifier for temporarily hold an analog signal input from the outside to output it to said coarse A/D converting unit and said first differential amplifier.

4. The two-step parallel A/D converter of claim 3, wherein
   said coarse A/D converting unit includes:
   reference voltage input terminals receiving reference voltage for A/D conversion of high-order digits;
   a plurality of resistances connected in series between said reference voltage input terminals; and
   a plurality of comparators having respective first terminals respectively connected to first terminals of said plurality of resistances and respective second terminals receiving an output from said sample-hold circuit and comparing the voltage of said first terminal with the voltage of said second terminal.

5. The two-step parallel A/D converter of claim 3, further comprising:
   second resistance means having its first terminal connected to a reference potential and its second terminal connected to said second input terminal of said first differential amplifier;
   third resistance means connecting between said first and second input terminals of said second differential amplifier and having its first terminal connected to said reference potential; and
   a second current source connected to a second terminal of said third resistance means for drawing specified current from said second terminal, and wherein;
   said D/A converting unit including a D/A converting unit which has a plurality of switches separately connected in series to said second resistance means for turning ON or OFF in accordance with outputs from said plurality of comparators and a plurality of first current sources respectively connected in series to said switches for outputting specified current.

6. The two-step parallel A/D converter of claim 1, wherein
   at least one of said first and second differential amplifiers includes:
   first and second input terminals receiving input signals thereon;
   a differential amplifying element for producing first and second outputs, including a pair of first and second transistors for differential operation having respective control electrodes connected to said first and second input terminals, and respective first and second output electrodes for said first and second outputs;

an output element having third and fourth transistors having respective first, second and control electrodes and receiving said first and second outputs from said differential amplifying element on said respective control electrodes of said third and fourth transistors and buffering said first and second outputs to output corresponding outputs;

fifth and sixth transistors having respective emitter and collector electrodes and respective base electrodes connected to said first and second input terminals and connecting serially to said third and fourth transistors; and a resistance connected between said emitter electrodes of said fifth and sixth transistors.

7. The two-step parallel A/D converter of claim 6, wherein said differential amplifying element includes:

first voltage developing means having a first terminal to a reference potential and a second terminal connected to said first electrode of said first transistor;

second voltage dropping means having a first terminal connected to said reference potential and a second terminal connected to said first electrode of said second transistor;

third voltage dropping means having first and second terminals respectively connected to said second electrodes of said first and second transistors, respectively;

first constant current means having a first terminal connected to said second electrode of said first transistor for flowing specified current through said second electrode of said first transistor;

second constant current means having a first terminal connected to said second electrode of said second transistor for flowing specified current through said second electrode of said second transistor;

third constant current means having a first terminal connected to said emitter electrode of said fifth transistor for flowing specified current through said emitter of said fifth transistor; and fourth constant current means having a first terminal connected to said emitter electrode of said sixth transistor for flowing specified current through said emitter electrode of said sixth transistor.

8. The two-step parallel A/D converter of claim 7, wherein said third transistor includes a bipolar transistor having a first electrode connected to said first terminal of said first voltage dropping means, a second electrode connected to said collector electrode of said fifth transistor, and a control electrode connected to said first electrode of said first transistor, and said fourth transistor includes a bipolar transistor identical in conductivity type of said third transistor, having a first electrode connected to said first terminal of said second voltage dropping means, a second electrode connected to said collector electrode of said sixth transistor and a control electrode connected to said first electrode of said second transistor.

9. The two-step parallel A/D converter of claim 8, wherein said fifth transistor includes a bipolar transistor identical in conductivity type of said first transistor, having a collector electrode connected to said second electrode of said third transistor, an emitter electrode connected to said first terminal of said third constant current means and a base electrode connected to said first input terminal; and said sixth transistor includes a bipolar transistor identical in conductivity type to said second transistor, having a collector electrode connected to said second electrode of said fourth transistor, an emitter electrode connected to said first terminal of said fourth constant current means and a base electrode connected to said second input terminal.

10. The two-step parallel A/D converter of claim 9, wherein said first to sixth transistors include NPN bipolar transistors.

11. The two-step parallel A/D converter of claim 9, wherein said first to sixth transistors include PNP bipolar transistors.

12. The two-step parallel A/D converter of claim 1, wherein a resistance value of said first resistance means is equal to the total resistance value of said plurality of resistances connected in series to said first and second output terminals of said second differential amplifier.

* * * * *